United States Patent
Chuang

(10) Patent No.: US 12,347,765 B2
(45) Date of Patent: Jul. 1, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 495 days.

(21) Appl. No.: 17/903,060

(22) Filed: Sep. 6, 2022

(65) Prior Publication Data
US 2022/0415784 A1    Dec. 29, 2022

Related U.S. Application Data

(63) Continuation of application No. PCT/CN2022/107694, filed on Jul. 25, 2022.

(30) Foreign Application Priority Data

Jul. 7, 2022 (CN) .......................... 202210804053.3

(51) Int. Cl.
H01L 23/48    (2006.01)
H01L 21/768    (2006.01)
(Continued)

(52) U.S. Cl.
CPC ........ H01L 23/5223 (2013.01); H01L 21/768 (2013.01); H01L 24/06 (2013.01);
(Continued)

(58) Field of Classification Search
CPC ... H01L 23/5223; H01L 21/768; H01L 24/06; H01L 24/08; H01L 24/80; H01L 24/05;
(Continued)

(56) References Cited

U.S. PATENT DOCUMENTS

| | | |
|---|---|---|
| 2011/0186978 A1 | 8/2011 | Kim et al. |
| 2016/0043060 A1 | 2/2016 | Kabe et al. |
| 2021/0242152 A1 | 8/2021 | Fountain, Jr. et al. |

FOREIGN PATENT DOCUMENTS

| | | |
|---|---|---|
| CN | 104051288 A | 9/2014 |
| CN | 109427746 A | 3/2019 |

(Continued)

OTHER PUBLICATIONS

ISA State Intellectual Property Office of the People's Republic of China, International Search Report Issued in Application No. PCT/CN2022/107694, Dec. 27, 2022, WIPO, 8 pages.
(Continued)

*Primary Examiner* — Niki H Nguyen
(74) *Attorney, Agent, or Firm* — Kilpatrick Townsend & Stockton LLP

(57) ABSTRACT

Embodiments relate to the field of semiconductors, and provide a semiconductor structure and a method for fabricating the same. The semiconductor structure includes a first wafer and a second wafer. A surface of the first wafer has a first electrode plate, a first dielectric layer and a first dummy pad stacked in sequence to constitute a capacitor; and the surface of the first wafer further has a first functional pad, and the first functional pad and the first dummy pad are arranged on a same layer. The second wafer is bonded to the first wafer, and a surface of the second wafer has a second dummy pad and a second functional pad arranged on a same layer. The first dummy pad is bonded to the second dummy pad, and the first functional pad is bonded to the second functional pad.

15 Claims, 6 Drawing Sheets

(51) Int. Cl.
    *H01L 23/00*     (2006.01)
    *H01L 23/52*     (2006.01)
    *H01L 23/522*     (2006.01)
    *H01L 29/40*     (2006.01)
    *H10D 1/68*     (2025.01)

(52) U.S. Cl.
    CPC .............. *H01L 24/08* (2013.01); *H01L 24/80* (2013.01); *H10D 1/692* (2025.01); *H01L 24/05* (2013.01); *H01L 2224/05624* (2013.01); *H01L 2224/05644* (2013.01); *H01L 2224/05647* (2013.01); *H01L 2224/06515* (2013.01); *H01L 2224/08145* (2013.01); *H01L 2224/80375* (2013.01); *H01L 2224/80895* (2013.01); *H01L 2224/80896* (2013.01)

(58) Field of Classification Search
    CPC . H01L 2224/05624; H01L 2224/05644; H01L 2224/05647; H01L 2224/06515; H01L 2224/80375; H01L 2224/80895; H01L 2224/80896; H01L 25/0657; H01L 2224/08145; H01L 2225/06541; H01L 2224/32145; H01L 23/5226; H01L 2225/06513; H01L 2224/16145; H01L 2224/12105; H01L 2224/08146; H01L 2224/0401; H01L 2224/48145; H01L 2225/06517; H01L 2224/48147; H01L 24/14; H01L 24/49; H01L 2224/06519; H01L 2224/0812; H01L 2224/32014; H01L 2224/08; H01L 25/0655; H01L 2224/1403; H01L 2224/16146; H01L 2224/73209; H01L 2224/214; H01L 2224/1134; H01L 2221/68359; H01L 2224/05082; H01L 2924/19106; H10D 1/692; H10D 30/66; H10D 30/021; H10D 84/0151; H10D 30/6735; H10B 43/30; H10B 41/42; H10B 10/12; H10B 10/00; H10B 12/00; H10B 12/31

See application file for complete search history.

(56) References Cited

FOREIGN PATENT DOCUMENTS

| | | | | |
|---|---|---|---|---|
| CN | 112530916 | * | 3/2021 | .............. H01L 21/18 |
| CN | 112530916 | A | 3/2021 | |
| CN | 113169159 | A | 7/2021 | |
| CN | 215183961 | U | 12/2021 | |

OTHER PUBLICATIONS

State Intellectual Property Office of the People's Republic of China, Office Action and Search Report Issued in Application No. 2022108039875, Oct. 31, 2024, 9 pages.

* cited by examiner

SEMICONDUCTOR STRUCTURE AND METHOD FOR FABRICATING SAME

CROSS REFERENCE

This application is a continuation of PCT/CN2022/107694, filed on Jul. 25, 2022, which claims priority to Chinese Patent Application No. 202210804053.3 titled "SEMICONDUCTOR STRUCTURE AND METHOD FOR FABRICATING SAME" and filed on Jul. 7, 2022, the entire contents of which are incorporated herein by reference.

TECHNICAL FIELD

Embodiments of the present disclosure relate to the field of semiconductors, and more particularly, to a semiconductor structure and a method for fabricating the same.

BACKGROUND

Hybrid Bonding is a technology that allows pads of two wafers to directly contact to produce molecular bonding. The Hybrid Bonding can provide higher interconnection density, smaller and simpler circuits, larger bandwidth, and lower power consumption, so it is widely used in the field of chip packaging.

However, space utilization of wafers using the Hybrid Bonding is not high.

SUMMARY

Embodiments of the present disclosure provide a semiconductor structure and a method for fabricating the same, which are at least beneficial to improving space utilization of a wafer.

According to some embodiments of the present disclosure, one aspect of the embodiments of the present disclosure provides a semiconductor structure. The semiconductor structure includes a first wafer and a second wafer. A surface of the first wafer has a first electrode plate, a first dielectric layer and a first dummy pad stacked in sequence to constitute a capacitor; and the surface of the first wafer further has a first functional pad, and the first functional pad and the first dummy pad are arranged on a same layer. The second wafer is bonded to the first wafer, and a surface of the second wafer has a second dummy pad and a second functional pad arranged on a same layer. The first dummy pad is bonded to the second dummy pad, and the first functional pad is bonded to the second functional pad.

According to some embodiments of the present disclosure, another aspect of the embodiments of the present disclosure further provides a method for fabricating the semiconductor structure. The method includes: providing a first wafer; forming, on a surface of the first wafer, a first electrode plate, a first dielectric layer and a first dummy pad stacked in sequence to constitute a capacitor; and forming a first functional pad on the surface of the first wafer, where the first functional pad and the first dummy pad are arranged on a same layer; providing a second wafer; forming, on a surface of the second wafer, a second dummy pad and a second functional pad arranged on a same layer; and bonding the first dummy pad to the second dummy pad, and bonding the first functional pad to the second functional pad, such that the first wafer is bonded to the second wafer.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION OF THE EMBODIMENTS

Figure 1:
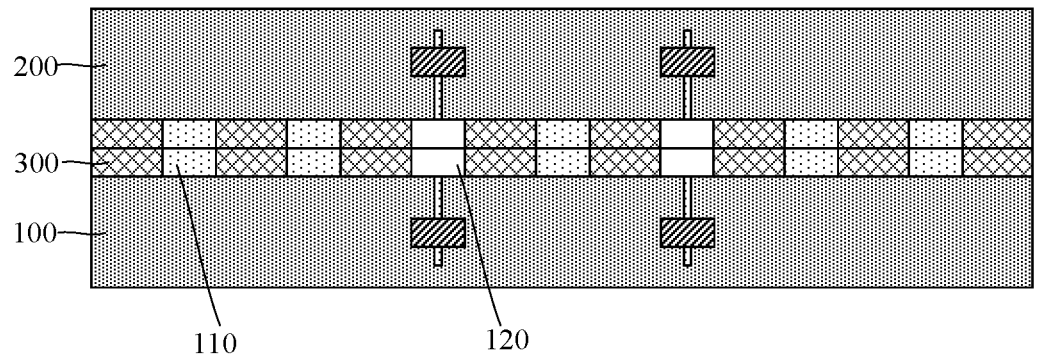
FIG. 1 illustrates a sectional view of a semiconductor structure.

Referring to FIG. 1, it is found through analysis that in a hybrid bonding process of a first wafer 100 and a second wafer 200, a surface dielectric layer 300 is polished by means of chemical mechanical polishing process. However, because a distance between functional pads 120 is larger, recesses may be generated on the surface dielectric layer 300. Therefore, number of pads may be increased to ensure that the dielectric layer after the chemical mechanical polishing has a smooth surface. The increased pads are called dummy pads 110, which do not have any other functions, so space on a surface of the wafer cannot be fully utilized.

Embodiments of the present disclosure provide a semiconductor structure, which includes a first wafer and a second wafer bonded to each other. A surface of the first wafer has a first electrode plate and a first dielectric layer, where the first electrode plate and the first dielectric layer constitute a capacitor together with a first dummy pad of the first wafer. The capacitor may replace component capacitors in the first wafer and the second wafer, thereby improving space utilization of the wafer.

The embodiments of the present disclosure will be described in detail below in conjunction with the accompanying drawings. However, a person of ordinary skill in the art may understand that in the embodiments of the present disclosure, many technical details are put forward such that a reader may better understand the present disclosure. However, the technical solutions requested to be protected by the embodiments of the present disclosure may also be implemented even without these technical details or various variations and modifications based on the following embodiments.

As shown in FIG. 2 to FIG. 14, an embodiment of the present disclosure provides a semiconductor structure, which includes a first wafer 1 and a second wafer 2. A surface of the first wafer 1 has a first electrode plate 17, a first dielectric layer 16 and a first dummy pad 11 stacked in sequence to constitute a capacitor C; and the surface of the first wafer 1 further has a first functional pad 12, and the first functional pad 12 and the first dummy pad 11 are arranged on a same layer. The second wafer 2 is bonded to the first wafer 1, and a surface of the second wafer 2 has a second dummy pad 21 and a second functional pad 22 arranged on a same layer. The first dummy pad 11 is bonded to the second dummy pad 21, and the first functional pad 12 is bonded to the second functional pad 22. That is, the capacitor C is formed by making full use of the dummy pads in a hybrid bonding wafer, to realize capacitance expansion and improve the space utilization of the wafer.

The semiconductor structure will be described in detail below with reference to the accompanying drawings.

First of all, it is to be noted that the semiconductor structure may be a chip, such as a memory chip. For example, the memory chip may be a dynamic random access memory (DRAM).

Referring to FIGS. 2 to 5, a material of the first wafer 1 and a material of the second wafer 2 may be silicon or germanium. The first wafer 1 and the second wafer 2 may have structures such as transistors, element capacitors, word lines, and bit lines, etc. The first wafer 1 and the second wafer 2 may have different structures. For example, one of the first wafer 1 and the second wafer 2 has the transistors, and the other one has the element capacitors. In addition, elements in the first wafer 1 and elements in the second wafer 2 may also be the same. For example, both of the first wafer 1 and the second wafer 2 have the transistors and the element capacitors.

The first dummy pad 11, the first functional pad 12, the second dummy pad 21 and the second functional pad 22 may have same material such as metal, which may be, for example, copper, gold, or aluminum, etc. A material of the first dielectric layer 16 may be $Si_3N_4$, $SiO_2$, SiCN, HfO, or ZrO, etc. A material of the first electrode plate 17 may be the same as that of the pad. For example, both the material of the first electrode plate 17 and the material of the pad are copper.

The first electrode plate 17 is positioned on the surface of the first wafer 1, which mainly includes following two cases. The surface of the first wafer 1 is a plane, and the first electrode plate 17 is directly formed on the surface of the first wafer 1; or the surface of the first wafer 1 is further provided with a groove 5 (referring to FIG. 16), and the first electrode plate 17 is positioned in the groove 5. In addition, the first dielectric layer 16 is positioned on the surface of the first wafer 1, which mainly in includes following two cases. The surface of the first wafer 1 the plane, and the first dielectric layer 16 is directly formed on the surface of the first wafer 1; or as shown in FIGS. 2 to 5, the surface of the first wafer 1 is provided with the groove 5, and the first dielectric layer 16 is positioned in the groove 5.

It is to be noted that the capacitor C constituted of the first dummy pad 11, the first dielectric layer 16 and the first electrode plate 17 may expand capacitances of the element capacitors or replace the element capacitors, such that it is advantageous to improving performance of the semiconductor structure, and improving the space utilization of the surface of the wafer. In some other embodiments, the capacitor C may also be used as a passive device in a circuit other than the first wafer 1 and the second wafer 2. Because the capacitor C is packaged with the first wafer 1 and the second wafer 2, this is advantageous to improving integration of package.

An area of the pad and an area of the first electrode plate 17 will be described below. It is worth noting that the area refers to an area of an orthographic projection of the pad and the first electrode plate 17 on an upper surface of the first wafer 1.

Figure 2:
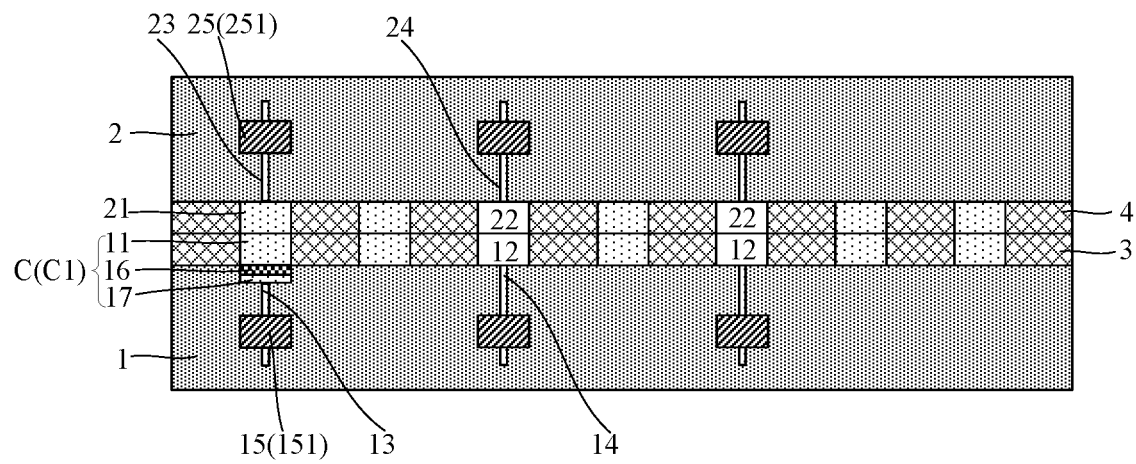
FIGS. 2 to 5 illustrate different sectional views of the semiconductor structure provided by an embodiment of the present disclosure along a stacking direction of a first wafer and a second wafer.
Figure 3:
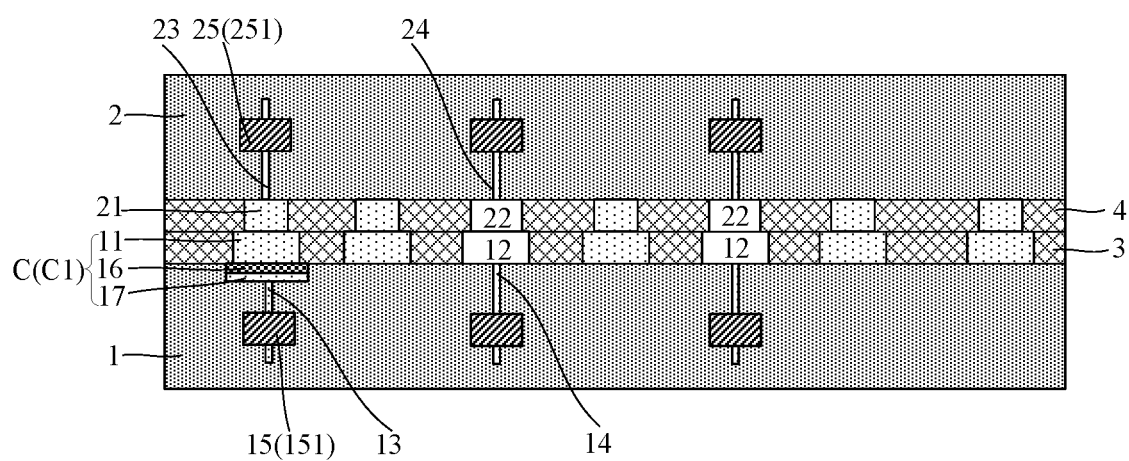
Figure 4:
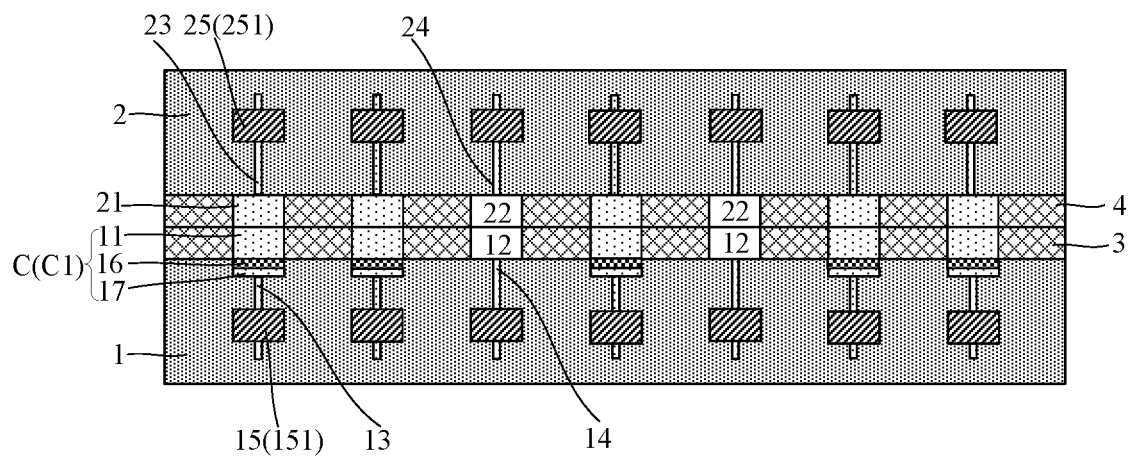
Figure 5:
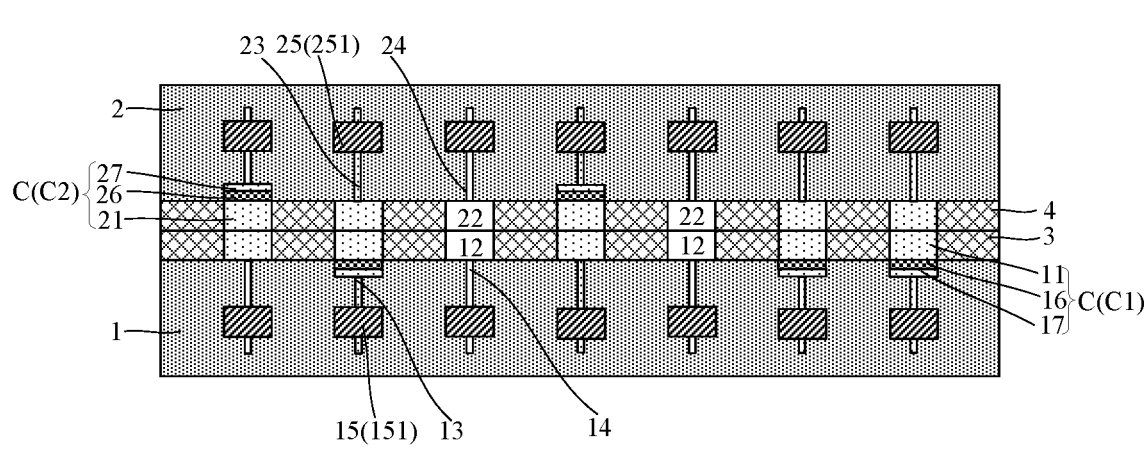

In some embodiments, referring to FIG. 2 and FIGS. 4 to 5, the area of the first electrode plate 17 is equal to that of the first dummy pad 11, which is beneficial to simplify fabrication processes. In some other embodiments, referring to FIG. 3, the area of the first electrode plate 17 is greater than that of the first dummy pad 11. It is to be noted that setting an area difference between the first electrode plate 17 and the first dummy pad 11 is beneficial to provide a certain margin for an alignment error, to increase an orthographic projection area for the first electrode plate 17 and the first dummy pad 11. In addition, when the area of the first dummy pad 11 is smaller, this can prevent the first dummy pad 11 from occupying too much space of a first surface dielectric layer 3, thereby improving an effect of isolation between the first dummy pad 11 and the first functional pad 12.

In some embodiments, referring to FIG. 2 and FIGS. 4 to 5, the area of the first dummy pad 11 is equal to that of the second dummy pad 21, which is beneficial to simplify the fabrication processes. In some other embodiments, referring to FIG. 3, the area of the first dummy pad 11 is greater than that of the second dummy pad 21. It is to be noted that setting an area difference between the first dummy pad 11 and the second dummy pad 21 is beneficial to provide a certain margin for the alignment error, to avoid occurrence of erroneously bonding the first dummy pad 11 to the non-corresponding second dummy pad 21 or the second functional pad 22. That is, when the area of the first dummy pad 11 is equal to that of the second dummy pad 21, the first dummy pad 11 likely may be electrically connected to other pads next to the second dummy pad 21 corresponding to the first dummy pad 11 in the event of the alignment error.

In some embodiments, referring to FIGS. 2 to 5, the area of the first dummy pad 11 is equal to that of the first functional pad 12, and the area of the second dummy pad 21 is equal to that of the second functional pad 22. Therefore, the fabrication processes are simpler, and the semiconductor structure has better uniformity.

For example, the area of the first dummy pad 11 ranges from $0.01$ $um^2$ to $100$ $um^2$, such as $1$ $um^2$, $50$ $um^2$ or $80$ $um^2$. The area of the second dummy pad 21 ranges from $0.01$ $um^2$ to $100$ $um^2$, such as $3$ $um^2$, $20$ $um^2$ or $60$ $um^2$. The area of the first functional pad 12 ranges from $0.01$ $um^2$ to $100$ $um^2$, such as $7$ $um^2$, $40$ $um^2$ or $90$ $um^2$. The area of the second functional pad 22 ranges from $0.01$ $um^2$ to $100$ $um^2$, such as $8$ $um^2$, $35$ $um^2$ or $78$ $um^2$. When the area of the first dummy pad 11, the area of the second dummy pad 21, the area of the first functional pad 12 and the area of the second functional pad 22 are within the above range, it is beneficial to improve a bonding strength, which can provide more sufficient space to the first surface dielectric layer 3 and a second surface dielectric layer 4, to ensure a better effect of isolation between the pads.

Referring to FIGS. 2 to 5, the first wafer 1 has a first wiring layer 15 therein, and the second wafer 2 has a second wiring layer 25 therein. The first wiring layer 15 and the second wiring layer 25 guide the structures in the first wafer 1 and the structures in the second wafer 2 out respectively for rewiring, to facilitate bonding during packaging.

Referring to FIGS. 2 to 5, the first wafer 1 has a first conductive plug 13 therein, where the first conductive plug 13 is positioned between the first electrode plate 17 and the first wiring layer 15, and is connected to both the first electrode plate 17 and the first wiring layer 15. That is, the first electrode plate 17 may be electrically connected to the first wiring layer 15 through the first conductive plug 13. The second wafer 2 has a third conductive plug 23 positioned between the second wiring layer 25 and the second dummy pad 21, and the third conductive plug 23 is connected to the second wiring layer 25 and the second dummy pads 21. That is, the second dummy pad 21 may be electrically connected to the second wiring layer 25 through the third conductive plug 23. Because the second dummy pad 21 is bonded to the first dummy pad 11, the second dummy pad 21 and the first dummy pad 11 may be entirely regarded as other electrode plate of the capacitor C. The two electrode plates of the capacitor C are electrically conductive through the first wiring layer 15 and the second wiring layer 25, respectively. Because the first wiring layer 15 and the second wiring layer 25 are positioned on two wafers, the capacitor C may be interpreted as an across-wafer capacitor C.

In some other embodiments, the capacitor C may not be connected to the second wiring layer 25. That is, the second dummy pad 21 or the first dummy pad 11 may also be electrically connected to an external component other than the first wafer 1 and the second wafer 2 through a connecting structure such as a wire, to connect the capacitor C to an circuit in the external component. Similarly, the capacitor C also may not be connected to the first wiring layer 15. That is, the capacitor C may be connected to one of the first wiring layer 15 and the second wiring layer 25.

Referring to FIGS. 2 to 5, the first wafer 1 further has a second conductive plug 14 therein, where the second conductive plug 14 is positioned between the first wiring layer 15 and the first functional pad 12, and is connected to both the first wiring layer 15 and the first functional pad 12. That is, the first functional pad 12 may be electrically connected to structures such as the transistors in the first wafer 1 through the second conductive plug 14 and the first wiring layer 15. The second wafer 2 also has a fourth conductive plug 24 therein, where the fourth conductive plug 24 is positioned between the second wiring layer 25 and the second functional pad 22, and is connected to both the second wiring layer 25 and the second functional pad 22. That is, the second functional pad 22 may be electrically connected to structures such as the transistors in the second wafer 2 through the fourth conductive plug 24 and the second wiring layer 25. Because the first functional pad 12 is bonded to the second functional pad 22, the electrical connection of the structures in the first wafer 1 and the second wafer 2 is achieved.

The capacitor C will be described in detail below.

Referring to FIGS. 2 to 5, the capacitor C constituted of the first dummy pad 11, the first dielectric layer 16 and the first electrode plate 17 is called a first capacitor C1. In some other embodiments, referring to FIG. 5, the surface of the second wafer 2 may further have a second electrode plate 27, a second dielectric layer 26 and a second dummy pad 21 stacked to constitute a capacitor C, which is referred to as a second capacitor C2. The second electrode plate 27 is similar to the first electrode plate 17, and the second dielectric layer 26 is similar to the first dielectric layer 16. Reference may be made to the first electrode plate 27 and the first dielectric layer 16 for detailed description of the second electrode plate 27 and the second dielectric layer 26.

Referring to FIGS. 2 to 3, there may be one capacitor C. In some embodiments, the capacitor C may be either the first capacitor C1 or the second capacitor C2. Accordingly, the semiconductor structure may have only one first dummy pad 11 or second dummy pad 21. In some embodiments, the semiconductor structure may have a plurality of first dummy pads 11 or a plurality of second dummy pads 21, except for dummy pads configured to constitute the capacitor C, other dummy pads are only configured for bonding.

Referring to FIGS. 4 to 5, there may be a plurality of capacitors C. In some embodiments, referring to FIG. 4, the plurality of capacitors C may be the first capacitors C1, or the plurality of capacitors C may be the second capacitors C2; or, referring to FIG. 5, some of the capacitors C are the first capacitors C1, and some of the capacitors C are the second capacitors C2.

Hereinafter, a connection relationship between the plurality of capacitors C will be described in detail below by taking an example where the capacitors C are the first capacitors C1.

In some embodiments, the plurality of capacitors C may be independent of each other.

That is, referring to FIGS. 4 to 5, although the plurality of capacitors C are connected to the first wiring layer 15 and the second wiring layer 25, the first wiring layer 15 includes a plurality of first conductive parts 151 insulated from each other, and the second wiring layer 25 includes a plurality of second conductive parts 251 insulated from each other. The plurality of capacitors C are connected to different first conductive parts 151 through a plurality of first conductive plugs 13, and the plurality of capacitors C are connected to different second conductive parts 251 through a plurality of third conductive plugs 23. Therefore, the first dummy pads 11 of the plurality of capacitors C are still insulated from each other, and the first electrode plates 17 of the plurality of capacitors C are still insulated from each other.

In some other embodiments, the plurality of capacitors C may also be connected in parallel with each other. That is, the semiconductor structure includes at least one capacitor bank C0, and the same capacitor bank C0 includes a plurality of capacitors C connected in parallel. Referring to FIGS. 6 to 13, parallel connection modes and arrangement modes of the capacitors C will be exemplified below.

Figure 6:
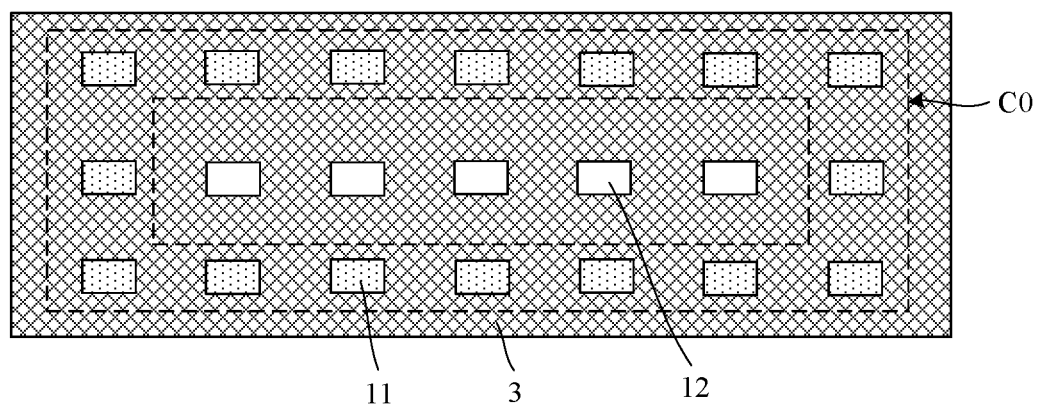
FIGS. 6 to 13 illustrate different sectional views of the semiconductor structure provided by an embodiment of the present disclosure along a direction parallel to an upper surface of the first wafer.
Figure 7:
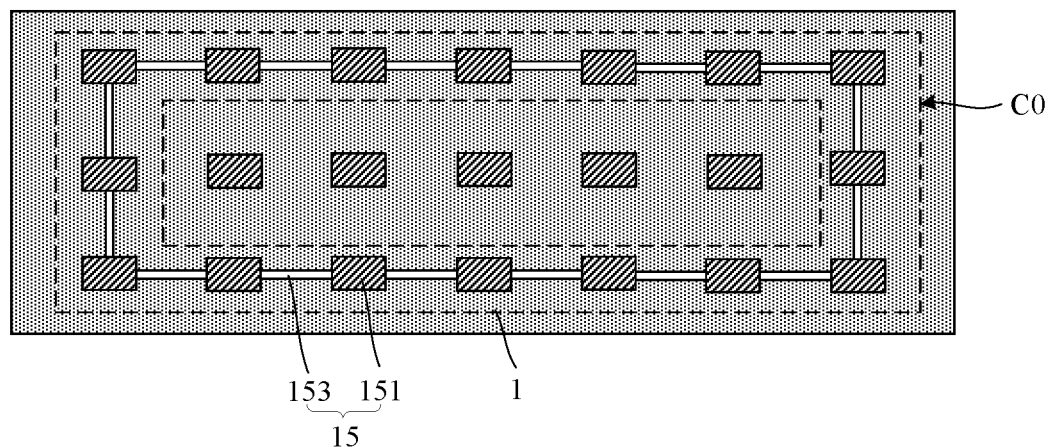
Figure 8:
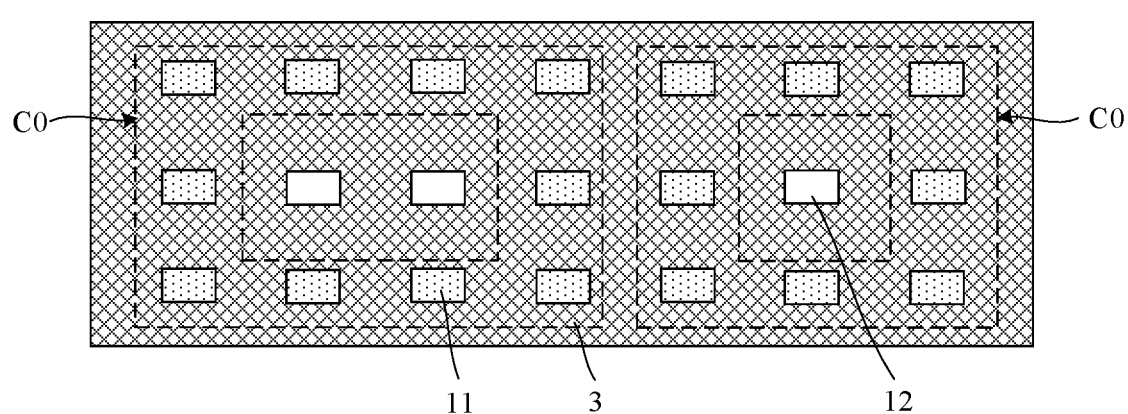
Figure 9:
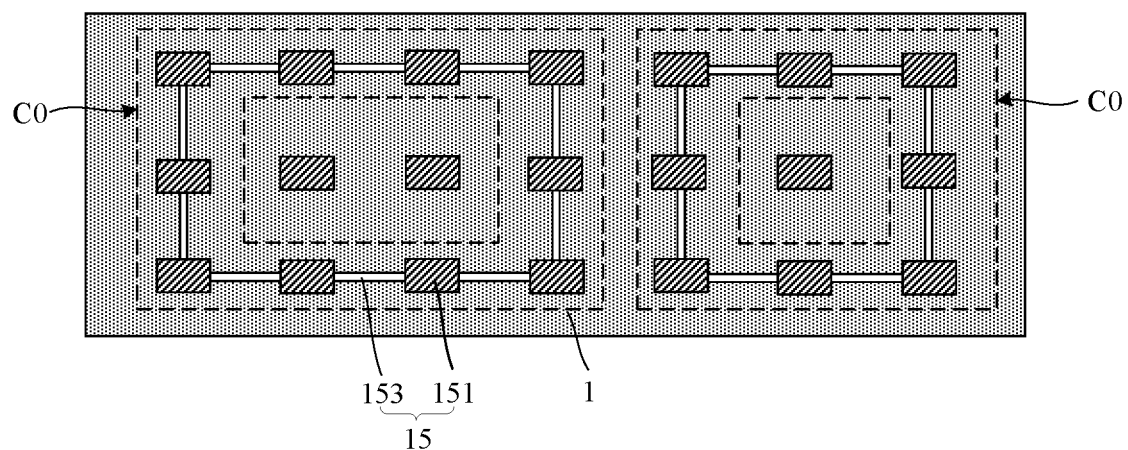
Figure 10:
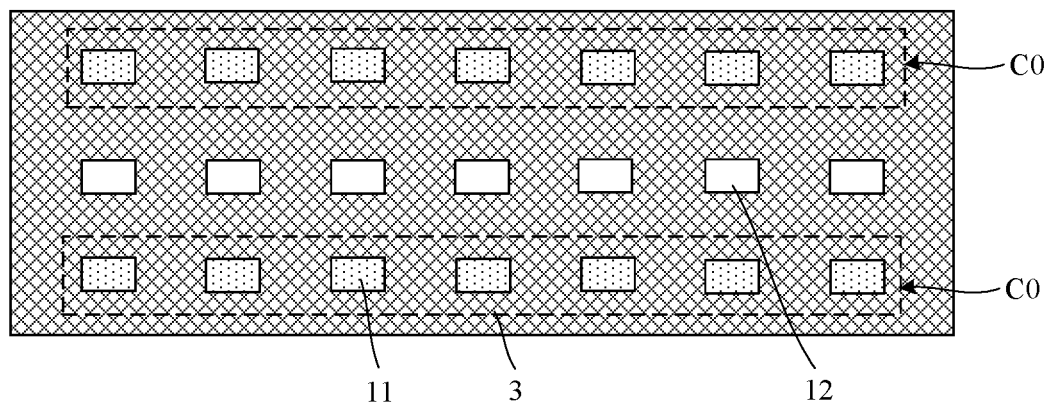
Figure 11:
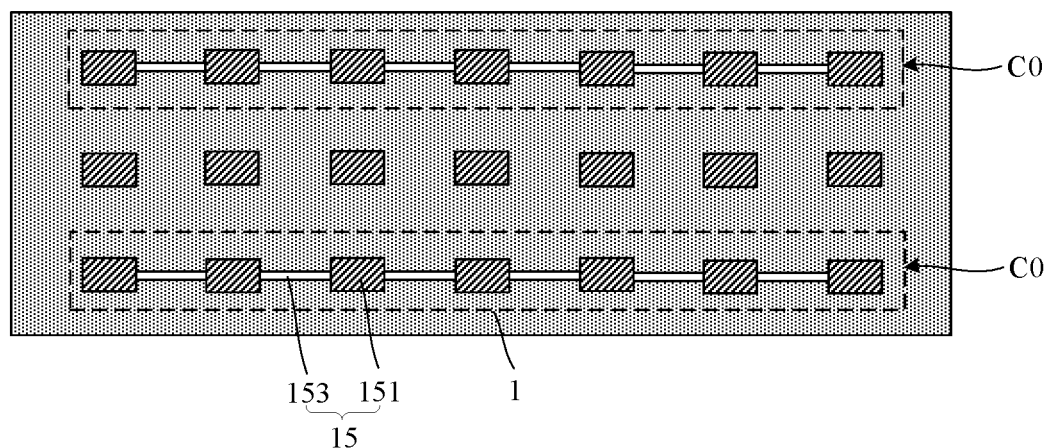
Figure 12:
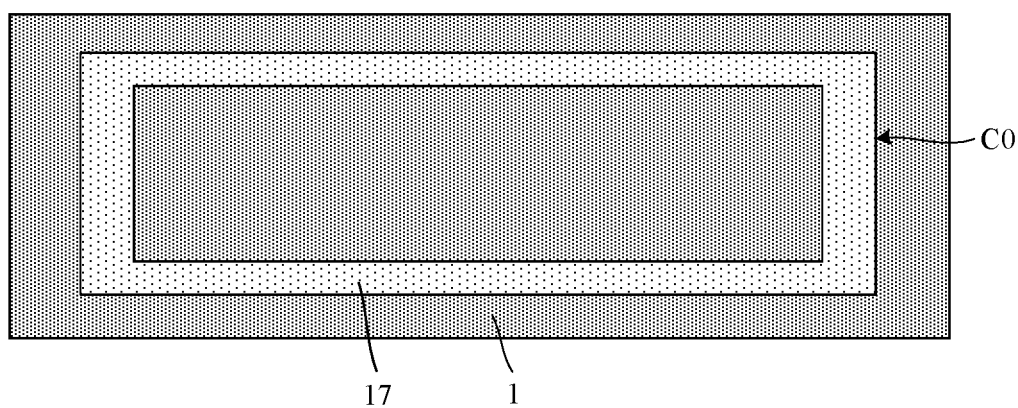
Figure 13:
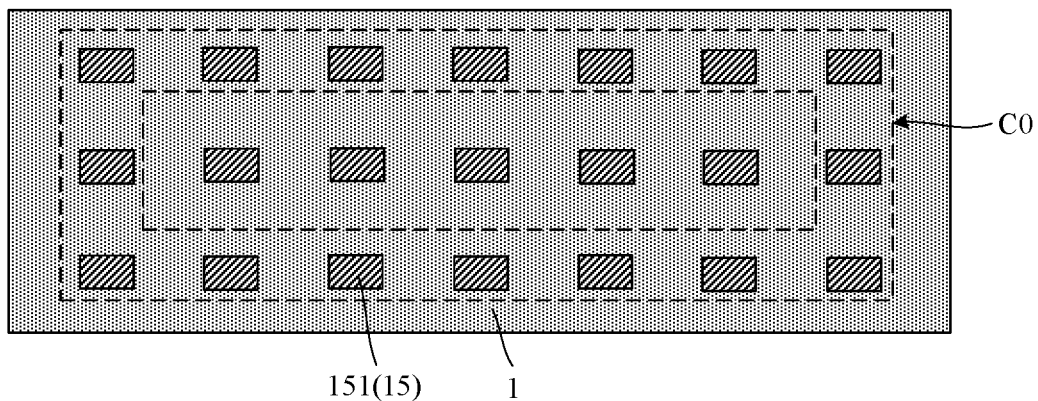

First of all, it is to be noted that FIGS. 6 to 13 are sectional views, and FIGS. 6 to 7 are different sectional views of the same semiconductor structure, where FIG. 6 shows a cross section of the first dummy pad 11 and a cross section of the first functional pad 12, and FIG. 7 shows a cross section of the first wiring layer 15. FIGS. 8 to 9 are different sectional views of the same semiconductor structure, where FIG. 8 shows a cross section of the first dummy pad 11 and a cross section of the first functional pads 12, and FIG. 9 shows the first wiring layer 15. FIGS. 10 to 11 show different sectional views of the same semiconductor structure, where FIG. 10 shows the cross section of the first dummy pad 11 and the cross section of the first functional pad 12, and FIG. 11 shows the cross section of the first wiring layer 15. FIGS. 12 to 13 show different sectional views of the same semiconductor structure, where FIG. 12 shows a cross section of the first electrode plate 17, and FIG. 13 shows the cross section of the first wiring layer 15.

In Example I, referring to FIGS. 6 to 11, there are a plurality of first electrode plates 17 and a plurality of first dummy pads 11, and the plurality of first electrode plates 17 are arranged in one-to-one correspondence to the plurality of first dummy pads 11. The semiconductor structure further includes a third conductive part 153 and a fourth conductive part (not shown in the figure). The third conductive part 153 is connected to the plurality of first conductive parts 151, such that the first electrode plates 17 of the plurality of capacitors C are electrically connected. The fourth conductive part is connected to the plurality of second conductive parts 251, such that the first dummy pads 11 of the plurality of capacitors C are connected to each other. In this way, a parallel connection of the plurality of capacitors C may be achieved. It is to be noted that the third conductive part 153 may belong to the first wiring layer 15 or other wiring layers; and the fourth conductive part may belong to the second wiring layer 25 or other wiring layers.

In some embodiments, referring to FIG. 6, the semiconductor structure has one capacitor bank C0, and the plurality of first dummy pads 11 of the plurality of capacitors C in the same capacitor bank C0 surround one or more first functional pads 12. Correspondingly, referring to FIG. 7, the first conductive parts 151 electrically connected to the first dummy pads 11 are connected to the third conductive part 153 to form an annular structure, which surrounds the first conductive parts 151 electrically connected to the first functional pads 12. Correspondingly, the plurality of second dummy pads 21 of the plurality of capacitors C in the same capacitor group C0 surround one or more second functional pads 22. In this way, it is advantageous to improving uniformity of distribution of the pads, and shortening a length of the third conductive part 153.

In some other embodiments, referring to FIG. 8, the semiconductor structure has a plurality of capacitor banks C0, and the plurality of first dummy pads 11 of the plurality of capacitors C in the same capacitor bank C0 surround one or more first functional pads 12. Number of the first functional pads 12 surrounded by different capacitor groups C0 may be equal or may be not equal. Correspondingly, referring to FIG. 9, the first conductive parts 151 electrically connected to the first dummy pads 11 are connected to the third conductive part 153 to form a plurality of annular structures, where each of the annular structures surrounds the first conductive parts 151 electrically connected to the first functional pads 12. Correspondingly, the plurality of second dummy pads 21 in the same capacitor group C0 surround one or more second functional pads 22 correspondingly.

In some other embodiments, referring to FIG. 10, there are a plurality of capacitor banks C0, and the plurality of capacitors C in the same capacitor bank C0 are arranged in the same direction. Correspondingly, the plurality of first dummy pads 11 in the same capacitor group C0 are arranged in the same direction. The plurality of second dummy pads 21 in the same capacitor group C0 are arranged in the same direction. Correspondingly, referring to FIG. 11, the plurality of first conductive parts 151 in the same capacitor group C0 are arranged in the same direction, such that the length of the third conductive part 153 is reduced. Similarly, the plurality of second conductive parts 251 in the same capacitor group C0 may also be arranged in the same direction, which is beneficial to reduce a length of the fourth conductive part (not shown in the figure), to reduce resistance, and to improve signal quality.

With continued reference to FIGS. 10 to 11, the plurality of capacitor banks C0 are arranged in parallel, and both the first functional pad 12 and the second functional pad 22 are positioned between adjacent capacitor banks C0. In this way, it is beneficial to improve the uniformity of the distribution of the first functional pads 12, the first dummy pads 11, the second functional pads 22 and the second dummy pads 21, thereby improving firmness of bonding and facilitating wiring layout the first wiring layer 15 and the second wiring layer 25.

In Example 2, referring to FIG. 12, there is one first electrode plate 17 and a plurality of first dummy pads 11, and the plurality of first dummy pads 11 are arranged opposite to the one first electrode plate 17. That is, the plurality of capacitors C share the one first electrode plate 17. Therefore, there is no need to connect the plurality of first conductive parts 151 through the third conductive parts 153, such that the first electrode plates 17 of the capacitors C are electrically connected to each other. In this way, the fabrication processes can be simplified and fabrication costs can be saved. In addition, the plurality of capacitors C may also share one first conductive plug 13 and one first conductive part 151. That is, the first electrode plate 17 shared by the plurality of capacitors C is connected to one first conductive part 151 of the first wiring layer 15 through one first conductive plug 13.

It is to be noted that the semiconductor structure further includes a fourth conductive part (not shown in the figure), where the fourth conductive part may be connected to the plurality of second conductive parts 251, such that the first dummy pads 11 of the plurality of capacitors C are conducted to each other. In this way, a parallel connection of the plurality of capacitors C may be achieved.

It is worth noting that, in some embodiments, the capacitor C is only constituted of the first dielectric layer 16, the first electrode plate 17, and the first dummy pad 11. In some other embodiments, referring to FIG. 14, the surface of the first wafer 1 further has a first connection layer 18; and the surface of the second wafer 2 further has a second electrode plate 27, a second dielectric layer 26, and a second connection layer 28. To increase a surface area of the electrode plate, the capacitor C may also be constituted of the first electrode plate 17, the second electrode plate 27, the first connection layer 18, the second connection layer 28, the first dummy pad 11, the second dummy pad 21, the first dielectric layer 16, and the second dielectric layer 26. For ease of understanding, this capacitor C is referred to as a third capacitor C3.

Figure 14:
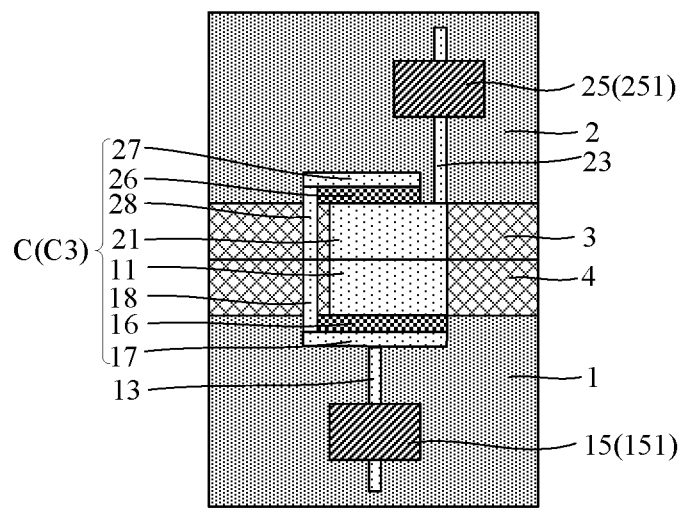
FIG. 14 illustrates a partial sectional view of the semiconductor structure provided by an embodiment of the present disclosure along the stacking direction of the first wafer and the second wafer.

In some embodiments, referring to FIG. 14, the second electrode plate 27, the second dielectric layer 26 and the second dummy pad 21 are sequentially stacked on the surface of the second wafer 2. The second connection layer 28 is connected to the second electrode plate 27, and is spaced apart from the second dummy pad 21. The first connection layer 18 is also connected to the first electrode plate 17 and is spaced apart from the first dummy pad 11. The first connection layer 18 is connected to the second connection layer 28, and both the first connection layer 18 and the second connection layer 28 extend in a direction perpendicular to the upper surface of the first wafer 1. That is, the first connection layer 18 and the second connection layer 28 electrically connect the first electrode plate 17 to the second electrode plate 27. The first electrode plate 17, the second electrode plate 27, the first connection layer 18 and the second connection layer 28 have the same potential, and together act as one electrode plate of the third capacitor C3. The first dummy pad 11 is bonded to the second dummy pad 21, to together serve as other electrode plate of the third capacitor C3. The first dielectric layer 16, the second dielectric layer 26, the first surface dielectric layer 3 between the first connection layer 18 and the first dummy pad 11, and the second surface dielectric layer 4 between the second connection layer 28 and the second dummy pad 21 together serve as the dielectric layer of the third capacitor C3. In this way, the orthographic projection area between the two electrode plates of the third capacitor C3 is larger, thereby increasing the capacitance of the capacitor.

With continued reference to FIG. 14, in some embodiments, the first electrode plate 17 may be connected to the first wiring layer 15 through the first conductive plug 13; and the second dummy pad 21 may be electrically connected to the second wiring layer 25 through the third conductive plug 23. That is, the two electrode plates of the third capacitor C3 are electrically conductive through the first wiring layer 15 and the second wiring layer 25. To provide a space for the third conductive plug 23, a width of the second electrode plate 27 may be appropriately reduced.

In some other embodiments, the second electrode plate 27 may be connected to the second wiring layer 25 through the third conductive plug 23, and the first dummy pad 11 may be electrically connected to the first wiring layer 15 through the first conductive plug 13. In some embodiments, the electrode plate constituted of the second dummy pads 21 and the first dummy pads 11 may not be electrically connected to the first wiring layer 15 or the second wiring layer 25, but may be connected to the circuit of the external component through a connection structure such as a wire.

To sum up, in the semiconductor structure provided by the embodiments of the present disclosure, the first electrode plate 17 and the first dielectric layer 16 are additionally provided. The first electrode plate 17 and the first dielectric layer 16 constitute, together with the first dummy pad 11, the capacitor C, which may replace element capacitors in a chip, thereby reducing an overall size of the chip while maintaining performance of the chip. The increased capacitor C may be freely used by the first wafer 1 and the second wafer 2. In addition, the plurality of capacitors C may be connected in parallel to expand the capacitance of the capacitor. In addition, the plurality of capacitors C may be connected in parallel to form an annular structure, and may also form multiple independent arrays respectively.

As shown in FIGS. 15 to 19, another embodiment of the present disclosure provides a method for fabricating a semiconductor structure, where the method may be configured for fabricating the semiconductor structure provided in the foregoing embodiments, and reference may be made to the foregoing embodiments for the detailed description of the semiconductor structure. It is to be noted that to facilitate the description and clearly illustrate the steps of the method for fabricating the semiconductor structure, FIGS. 15 to 19 are all partial schematic structural diagrams of the semiconductor structure.

The method for fabricating the semiconductor structure provided by yet another embodiment of the present disclosure will be described in detail below with reference to the accompanying drawings.

Figure 15:
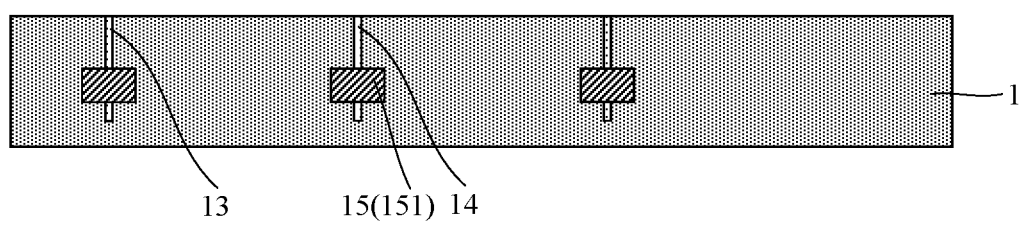
FIGS. 15 to 19 illustrate schematic structural diagrams corresponding to steps of a method for fabricating the semiconductor structure provided by an embodiment of the present disclosure.

Referring to FIG. 15, the first wafer 1 is provided; the first wiring layer 15 is formed in the first wafer 1; and a first conductive plug 13 and a second conductive plug 14 connected to the first wiring layer 15 are formed in the first wafer 1.

In some embodiments, a metal layer is deposited on the entire surface to serve as an initial first wiring layer, and the initial first wiring layer is patterned to form a plurality of mutually insulated first conductive parts 151 to constitute the first wiring layer 15. The first wafer 1 is etched to form vias exposing the first wiring layer 15, and metal is deposited in the vias to form the first conductive plug 13 and the second conductive plug 14.

Figure 16:
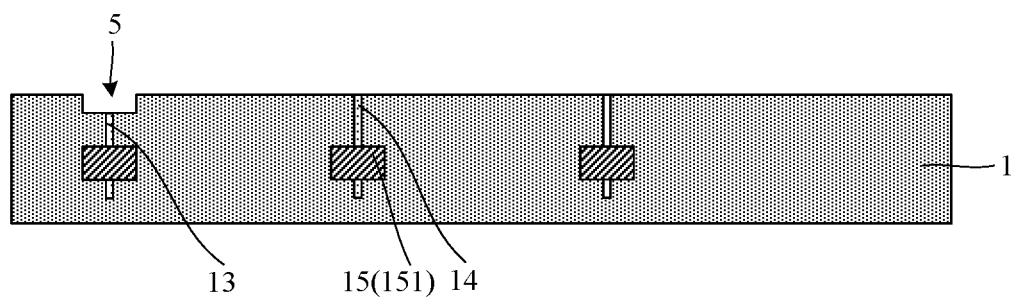

Referring to FIG. 16, the first wafer 1 is removed by a part of thickness to form a groove 5 in the first wafer 1, where the groove 5 is positioned directly above the first conductive plug 13. For example, the groove 5 is formed by means of a dry etching process. During the formation of the groove 5, the first conductive plug 13 is also removed by a part of length.

Figure 17:
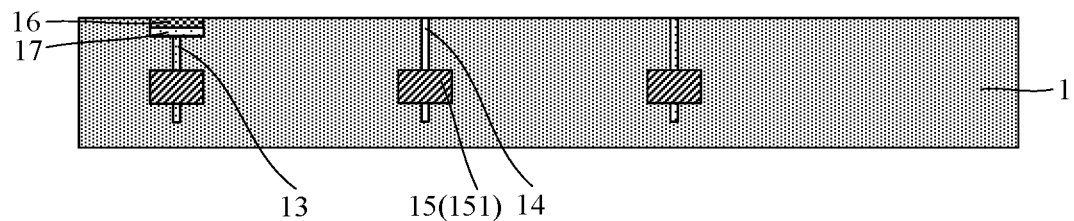

Referring to FIG. 17, the first electrode plate 17 is formed in the groove 5, and the first electrode plate 17 is connected to the first conductive plug 13. For example, a metal layer is deposited in the groove 5, and the metal layer is etched back, and a remaining part of the metal layer is used as the first electrode plate 17.

With continued reference to FIG. 17, the first dielectric layer 16 is formed in the groove, and the first dielectric layer 16 also covers the first electrode plate 17. For example, an insulating material is deposited in the groove 5 by means of a chemical vapor deposition process to form the first dielectric layer 16.

Figure 18:
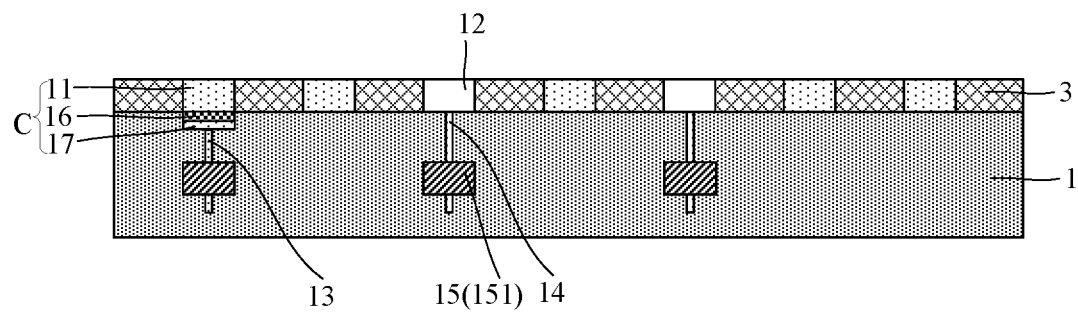

Referring to FIG. 18, the first surface dielectric layer 3 is formed on the surface of the first wafer 1. For example, the insulating material is deposited on the surface of the first wafer 1 by means of the chemical vapor deposition process to form the first surface dielectric layer 3. In some embodiments, the first dielectric layer 16 and the first surface dielectric layer 3 may be formed in the same step, which is beneficial to simplify the fabrication processes.

With continued reference to FIG. 18, the first dummy pad 11 and the first functional pad 12 are formed in the first surface dielectric layer 3, where the first dummy pad 11 is positioned directly above the first electrode plate 17, and the first functional pad 12 is connected to the second conductive plug 14. For example, the first surface dielectric layer 3 is patterned to form a plurality of filling grooves, and the metal layer is deposited in the plurality of filling grooves to serve as the first dummy pad 11 and the first functional pad 12.

So far, based on FIGS. 15 to 18, the first electrode plate 17, the first dielectric layer 16 and the first dummy pad 11 stacked in sequence may be formed on the surface of the first wafer 1, to constitute the capacitor C. In addition, the first functional pad 12 may also be formed on the surface of the first wafer 1, where the first functional pad 12 and the first dummy pad 11 are arranged on the same layer.

Figure 19:
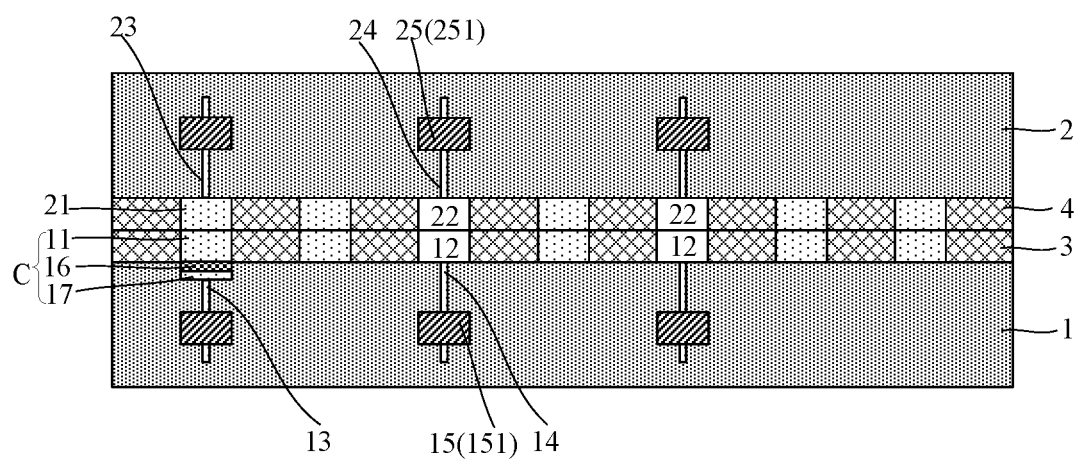

Referring to FIG. 19, the second wafer 2 is provided; and the second dummy pad 21 and the second functional pad 22, which are arranged on the same layer, are formed on the surface of the second wafer 2. The third conductive plug 23, the fourth conductive plug 24 and the second wiring layer 25 may also be formed in the second wafer 2. Reference may be made to the first wafer 1 for a detailed description of the second wafer 2, which is not to be described in detail here.

With continued reference to FIG. 19, the first dummy pad 11 is bonded to the second dummy pad 21, and the first functional pad 12 is bonded to the second functional pad 22, such that the first wafer 1 is bonded to the second wafer 2. Under the action of a high temperature and a pressure, the first wafer 1 and the second wafer 2 are bonded together by Van der Waals force, molecular force, and atomic force. It is to be noted that a bonding manner between the first wafer 1 and the second wafer 2 may be as below: front surfaces of the first wafer 1 and the second wafer 2 are bonded together; or, the front surface of one of the first wafer 1 and the second wafer 2 is bonded to a back surface of the other one.

To sum up, in the embodiments of the present disclosure, before forming the first dummy pad 11, the first electrode plate 17 and the first dielectric layer 16 are formed in the first wafer 1, thereby the capacitor C is formed. The capacitor C may replace the element capacitor in the first wafer 1 or the second wafer 2, or may be configured to increase the capacitance of the element capacitor. In this way, the space utilization of the surface of wafer can be improved.

In the description of this specification, reference to the description of the terms "some embodiments", "for example", etc. means that a particular feature, structure, material or characteristic described in connection with this embodiment or example is included in at least one embodiment or example of the present disclosure. The schematic representation of the above terms throughout this specification are not necessarily referring to the same embodiment or example. Furthermore, the features, structures, materials, or characteristics described may be combined in any suitable manner in one or more embodiments or examples. In addition, without contradiction, those skilled in the art may combine different embodiments or examples described in the specification and features of different embodiments or examples.

Although the embodiments of the present disclosure have been shown and described above, it is to be understood that the above-mentioned embodiments are exemplary and should not be construed as limiting the present disclosure. Those of ordinary skill in the art may make changes, modifications, replacements and variations to the above embodiments without departing from the scope of the present disclosure. Therefore, all changes or embellishments made according to the claims and the specification of the present disclosure shall still fall within the scope covered by the patent of the present disclosure.

What is claimed is:

1. A semiconductor structure, comprising:
    a first wafer, a surface of the first wafer having a first electrode plate, a first dielectric layer and a first dummy pad stacked in sequence to constitute a capacitor; and the surface of the first wafer further having a first functional pad, and the first functional pad and the first dummy pad being arranged on a same layer; and
    a second wafer bonded to the first wafer, a surface of the second wafer having a second dummy pad and a second functional pad arranged on a same layer; the first dummy pad being bonded to the second dummy pad, and the first functional pad being bonded to the second functional pad.

2. The semiconductor structure according to claim 1, wherein the first wafer is internally provided with a first wiring layer, a first conductive plug and a second conductive plug, the first conductive plug being positioned between the first electrode plate and the first wiring layer and being connected to the first electrode plate and the first wiring layer, and the second conductive plug being positioned between the first wiring layer and the first functional pad and being connected to the first wiring layer and the first functional pad; and
    wherein the second wafer is internally provided with a second wiring layer, a third conductive plug and a fourth conductive plug, the third conductive plug being positioned between the second wiring layer and the second dummy pad and being connected to the second wiring layer and the second dummy pad, and the fourth conductive plug being positioned between the second wiring layer and the second functional pad and being connected to the second wiring layer and the second functional pad.

3. The semiconductor structure according to claim 2, wherein the semiconductor structure comprises at least one capacitor bank, the same capacitor bank comprising a plurality of capacitors in parallel.

4. The semiconductor structure according to claim 3, wherein there are a plurality of first electrode plates and a plurality of first dummy pads, and the plurality of first electrode plates are arranged in one-to-one correspondence to the plurality of first dummy pads.

5. The semiconductor structure according to claim 3, wherein there is one first electrode plate and a plurality of first dummy pads, and the plurality of first dummy pads are arranged opposite to the one first electrode plate.

6. The semiconductor structure according to claim 3, wherein the plurality of first dummy pads of the plurality of capacitors in the same capacitor bank surround one or more of the first functional pads; and the plurality of second dummy pads of the plurality of capacitors in the same capacitor bank surround one or more of the second functional pads.

7. The semiconductor structure according to claim 3, wherein there are a plurality of capacitor banks, and the plurality of capacitors in the same capacitor bank are arranged in a same direction.

8. The semiconductor structure according to claim 7, wherein the plurality of capacitor banks are arranged in parallel, and the first functional pad and the second functional pad are both positioned between adjacent two of the plurality of capacitor banks.

9. The semiconductor structure according to claim 1, wherein an area of the first electrode plate is greater than or equal to an area of the first dummy pad.

10. The semiconductor structure according to claim 1, wherein an area of the first dummy pad is greater than or equal to an area of the second dummy pad.

11. The semiconductor structure according to claim 1, wherein an area of the first dummy pad is equal to an area of the first functional pad, and an area of the second dummy pad is equal to an area of the second functional pad.

12. The semiconductor structure according to claim 11, wherein the area of the first dummy pad is 0.01 um$^2$ to 100 um$^2$, the area of the second dummy pad being 0.01 um$^2$ to 100 um$^2$, the area of the first functional pad being 0.01 um$^2$ to 100 um$^2$, and the area of the second functional pad being 0.01 um$^2$ to 100 um$^2$.

13. The semiconductor structure according to claim 1, wherein the surface of the second wafer further has a second electrode plate, a second dielectric layer and a second connection layer; the second electrode plate, the second dielectric layer and the second dummy pad are sequentially stacked on the surface of the second wafer; and the second connection layer is connected to the second electrode plate and is spaced apart from the second dummy pad;
    the surface of the first wafer further has a first connection layer, the first connection layer being further connected to the first electrode plate and being spaced apart from the first dummy pad; and
    the first connection layer is connected to the second connection layer, both the first connection layer and the second connection layer extending in a direction perpendicular to an upper surface of the first wafer.

14. A method for fabricating a semiconductor structure, comprising:
    providing a first wafer;
    forming, on a surface of the first wafer, a first electrode plate, a first dielectric layer and a first dummy pad stacked in sequence to constitute a capacitor; and forming a first functional pad on the surface of the first wafer, the first functional pad and the first dummy pad being arranged on a same layer;
    providing a second wafer;
    forming, on a surface of the second wafer, a second dummy pad and a second functional pad arranged on a same layer; and
    bonding the first dummy pad to the second dummy pad, and bonding the first functional pad to the second functional pad, such that the first wafer is bonded to the second wafer.

15. The method for fabricating the semiconductor structure according to claim 14, wherein before forming the first electrode plate, the method further comprises:
- forming a first wiring layer in the first wafer;
- forming, in the first wafer, a first conductive plug and a second conductive plug connected to the first wiring layer;
- forming the capacitor comprises:
- removing the first wafer by a part of thickness to form a groove in the first wafer, the groove being positioned directly above the first conductive plug;
- forming a first electrode plate in the groove, the first electrode plate being connected to the first conductive plug;
- forming a first dielectric layer in the groove, the first dielectric layer further covering the first electrode plate;
- forming a first surface dielectric layer on the surface of the first wafer; and
- forming a first dummy pad and a first functional pad in the first surface dielectric layer, the first dummy pad being positioned directly above the first electrode plate, and the first functional pad being connected to the second conductive plug.

\* \* \* \* \*